US012725985B2

(12) United States Patent
Tuin et al.

(10) Patent No.: US 12,725,985 B2
(45) Date of Patent: Sep. 1, 2026

(54) GROUND SHIELD CONTACT MEMBER

(71) Applicants: TE Connectivity Nederland B.V., s'Hertogenbosch (NL); TE Connectivity Solutions GmbH, Schaffhausen (CH)

(72) Inventors: Jacobus Nicolaas Tuin, Looierstraat Best (NL); Bruce Allen Champion, Camp Hill, PA (US); Charles Raymond Gingrich, III, Mechanicsburg, PA (US); Keith Edwin Miller, Manheim, PA (US); Kyle Gary Annis, Hummelstown, PA (US); Rutger Wilhelmus Smink, Hamont-Achel (BE); Sander Floris, Lennisheuvel (NL); Scott Eric Walton, Mount Joy, PA (US)

(73) Assignee: TE Connectivity Solutions Gmbh (CH)

( * ) Notice: Subject to any disclaimer, the term of this patent is extended or adjusted under 35 U.S.C. 154(b) by 344 days.

(21) Appl. No.: 18/589,478

(22) Filed: Feb. 28, 2024

(65) Prior Publication Data

US 2024/0313476 A1 Sep. 19, 2024

Related U.S. Application Data

(60) Provisional application No. 63/490,014, filed on Mar. 14, 2023.

(51) Int. Cl.
*H01R 13/6587* (2011.01)
*H01R 12/71* (2011.01)
(Continued)

(52) U.S. Cl.
CPC ....... *H01R 13/6587* (2013.01); *H01R 12/716* (2013.01); *H01R 12/721* (2013.01);
(Continued)

(58) Field of Classification Search
CPC .......................... H01R 13/6587; H01R 12/716
(Continued)

(56) References Cited

U.S. PATENT DOCUMENTS 5,423,691 A 6/1995 Pickles
6,171,115 B1 1/2001 Mickievicz et al.
(Continued)

FOREIGN PATENT DOCUMENTS

CN 102214865 A 10/2011
CN 102340067 A 2/2012
(Continued)

OTHER PUBLICATIONS

Montrose, "Printed Circuit Board Design Techniques for EMC Compliance" Handbook for Designers, IEEE Press Series, 340 pgs, 2000.

(Continued)

*Primary Examiner* — Phuong K Dinh

(57) ABSTRACT

An electrical connector with a housing having at least one slot for receiving an electrical wafer therein. Signal contacts are positioned on a first side of the at least one slot. The signal contact resilient contact arms exert a first normal force on the electrical wafer inserted in the at least one slot. At least one ground shield contact member is positioned on a second side of the at least one slot. The ground shield resilient contact arms exert a second normal force on the wafer inserted in the at least one slot. The second normal force exerted by the ground shield resilient contact arms is greater than the first normal force exerted by the signal contact resilient contact arms. The wafer is biased toward the signal contact resilient contact arms of the signal contacts regardless of a thickness of the wafer.

17 Claims, 6 Drawing Sheets

(51) Int. Cl.

| | |
|---|---|
| ***H01R 12/72*** | (2011.01) |
| ***H01R 13/193*** | (2006.01) |
| ***H01R 13/26*** | (2006.01) |
| ***H01R 13/6471*** | (2011.01) |
| ***H01R 13/6585*** | (2011.01) |
| ***H05K 1/02*** | (2006.01) |

(52) U.S. Cl.
CPC ......... *H01R 12/724* (2013.01); *H01R 13/193* (2013.01); *H01R 13/26* (2013.01); *H01R 13/6471* (2013.01); *H01R 13/6585* (2013.01); *H05K 1/0251* (2013.01)

(58) Field of Classification Search
USPC ................................. 439/60, 607.06, 607.07
See application file for complete search history.

(56) References Cited

U.S. PATENT DOCUMENTS

| | | | | |
|---|---|---|---|---|
| 6,245,166 | B1 | 6/2001 | Shibuya et al. | |
| 6,267,604 | B1 | 7/2001 | Mickievicz et al. | |
| 6,824,391 | B2 | 11/2004 | Mickievicz et al. | |
| 7,175,445 | B2 | 2/2007 | Consoli et al. | |
| 7,909,648 | B2 | 3/2011 | Tai | |
| 8,662,925 | B2 * | 3/2014 | Gao | H01R 13/6582 439/607.35 |
| 9,590,340 | B2 | 3/2017 | Blumenschein et al. | |
| 2004/0072467 | A1 * | 4/2004 | Jordan | H01R 12/775 439/492 |
| 2006/0121781 | A1 | 6/2006 | Zhang et al. | |
| 2013/0014979 | A1 | 1/2013 | Uzoh et al. | |
| 2013/0059471 | A1 | 3/2013 | Mongold et al. | |
| 2014/0113490 | A1 | 4/2014 | Simmel et al. | |
| 2015/0228706 | A1 | 8/2015 | Lee et al. | |
| 2017/0018881 | A1 | 1/2017 | Patel et al. | |
| 2019/0052006 | A1 | 2/2019 | Liu et al. | |
| 2019/0162768 | A1 | 5/2019 | Chandra | |
| 2019/0173214 | A1 | 6/2019 | Leidner et al. | |
| 2020/0296822 | A1 | 9/2020 | Choi et al. | |

FOREIGN PATENT DOCUMENTS

| | | | |
|---|---|---|---|
| EP | 3293836 | A1 | 3/2018 |
| JP | S55125073 | U | 9/1980 |
| WO | 02/063682 | A2 | 8/2002 |
| WO | 2005015692 | A1 | 2/2005 |
| WO | 2008001459 | A1 | 1/2008 |
| WO | 2010011753 | A1 | 1/2010 |

OTHER PUBLICATIONS

Peterson, Stripline vs Microstrip: PCB Routing Differences and Guidelines, Altium Agile, pp. 1-6, Oct. 23, 2020.

Unknown, “What is the Difference Between Microstrip and Stripline in BCBs?” Sierra Circuits Team, pp. 1-35, Feb. 1, 2021.

Unknown, “What is Via Stitching and Why it is Useful?”, PCB Trace, 3 pgs, Jul. 29, 2021.

International Search Report, International App. No. PCT/IB2024/052490 International Filing Date Mar. 14, 2024.

International Search Report, International App. No. PCT/IB2024/052491 International Filing Date Mar. 14, 2024.

International Search Report, International App. No. PCT/IB2024/052493 International Filing Date Mar. 14, 2024.

* cited by examiner 10
14
18
30
16
34
12
3,4,5
3,4,5
32
20

14
18
12
36
30
42
20
34
32
40
22
16

62
60
80
44
6
66
76
64
78
68
70

80
72
76
78
6
68
64
60
80
44
76
78
62
66
68
62
44
64
74
80
60
76

72
70
78
76
74
78

GROUND SHIELD CONTACT MEMBER

CROSS REFERENCE TO RELATED APPLICATIONS

This application claims priority to U.S. Provisional Patent Application Ser. No. 63/490,014 filed on Mar. 14, 2023 which is incorporated herein by reference in its entirety.

FIELD OF THE INVENTION

The invention relates to a ground shield contact member which integrates the function of ground contacts and shielding in a single component. In particular, the ground shield component serves multiple purposes for signal integrity (SI), connector mechanical requirements, and manufacturability.

BACKGROUND OF THE INVENTION

Due to the increasing complexity of electronic components, it is desirable to fit more components in less space on a circuit board or other substrate. Consequently, the spacing between electrical terminals within connectors has been reduced, while the number of electrical terminals housed in the connectors has increased, thereby increasing the need in the electrical arts for electrical connectors that are capable of handling higher and higher speeds and to do so with greater and greater pin densities. It is desirable for such connectors to have not only reasonably constant impedance levels, but also acceptable levels of impedance and crosstalk, as well as other acceptable electrical and mechanical characteristics. Therefore, there remains a need to provide appropriate shielding to preserve signal integrity and to minimize crosstalk as speeds of signals increase and the footprint of the connector remains the same or decreases.

It would, therefore, be beneficial to provide a ground shield contact member which integrates the function of ground contacts and shielding in a single component. It would also be beneficial to provide a connector assembly in which the signal path in the signal contact is minimized to improve the signal integrity.

SUMMARY OF THE INVENTION

The following provides a summary of certain illustrative embodiments of the present invention. This summary is not an extensive overview and is not intended to identify key or critical aspects or elements of the present invention or to delineate its scope.

The connector system includes a ground shield contact component which integrates the function of ground contacts and shielding in a single component. The ground shield component serves multiple purposes for signal integrity, connector mechanical requirements, and manufacturability.

The ground shield contact makes the connection from the backplane to the connector system's back side ground planes on the wafers. This provides both the ground connection and the needed shield in the area of the backplane signal contacts. Mechanically, the ground shield contact pushes the connector wafer towards the plastic housing wall adjacent to the signal contacts. This reduces the tolerance stack up that contributes to variation of normal force between the signal contact and the wafer mating pads. The ground shield contact is designed to meet the signal integrity parameters so that regular ground contacts to not have to be stitched adjacent to the signal contacts in the backplane connector.

An additional benefit is the ground shield contact can also provide significant current carrying capacity to the wafer based connector system for power wafer variants. The ground shield contact provides a current path to the back side of the power wafer and provide a large surface area for heatsinking.

The ground shield contact provides a positive low resistance connection between the BP PCB and the wafers in the wafer based connector. It also biases the wafer to reduce tolerance stack up for more consistent normal force from the wafer to the signal contacts. It also provides a positive low resistance connection in power wafer applications to enhance the current capacity.

An embodiment is directed to an electrical connector with a housing having at least one slot for receiving an electrical wafer therein. Signal contacts are positioned on a first side of the at least one slot. The signal contacts have signal contact resilient contact arms which extend into the at least one slot. The signal contact resilient contact arms exert a first normal force on the electrical wafer inserted in the at least one slot. At least one ground shield contact member is positioned on a second side of the at least one slot. The second side is opposed to the first side. The at least one ground shield contact member have ground shield resilient contact arms which extend into the at least one slot. The ground shield resilient contact arms exert a second normal force on the wafer inserted in the at least one slot. The second normal force exerted by the ground shield resilient contact arms is greater than the first normal force exerted by the signal contact resilient contact arms. The wafer is biased toward the signal contact resilient contact arms of the signal contacts regardless of a thickness of the wafer allowing the first normal force exerted on the wafer to be independent of a wafer thickness tolerance.

An embodiment is directed to an electrical connector having a ground shield contact member. The ground shield contact member includes a planar ground shield portion Ground shield resilient contact arms extend from a first end of the planar ground shield portion. The ground shield resilient contact arms are configured to exert a normal force on a wafer inserted in a slot of the electrical connector. The normal force exerted by the ground shield resilient contact arms biases the wafer toward a signal contacts of the connector regardless of a thickness of the wafer. The ground shield contact member is configured to provide grounding and shielding.

Additional features and aspects of the present invention will become apparent to those of ordinary skill in the art upon reading and understanding the following detailed description of the exemplary embodiments. As will be appreciated by the skilled artisan, further embodiments of the invention are possible without departing from the scope and spirit of the invention. Accordingly, the drawings and associated descriptions are to be regarded as illustrative and not restrictive in nature.

Figures 1, 2:
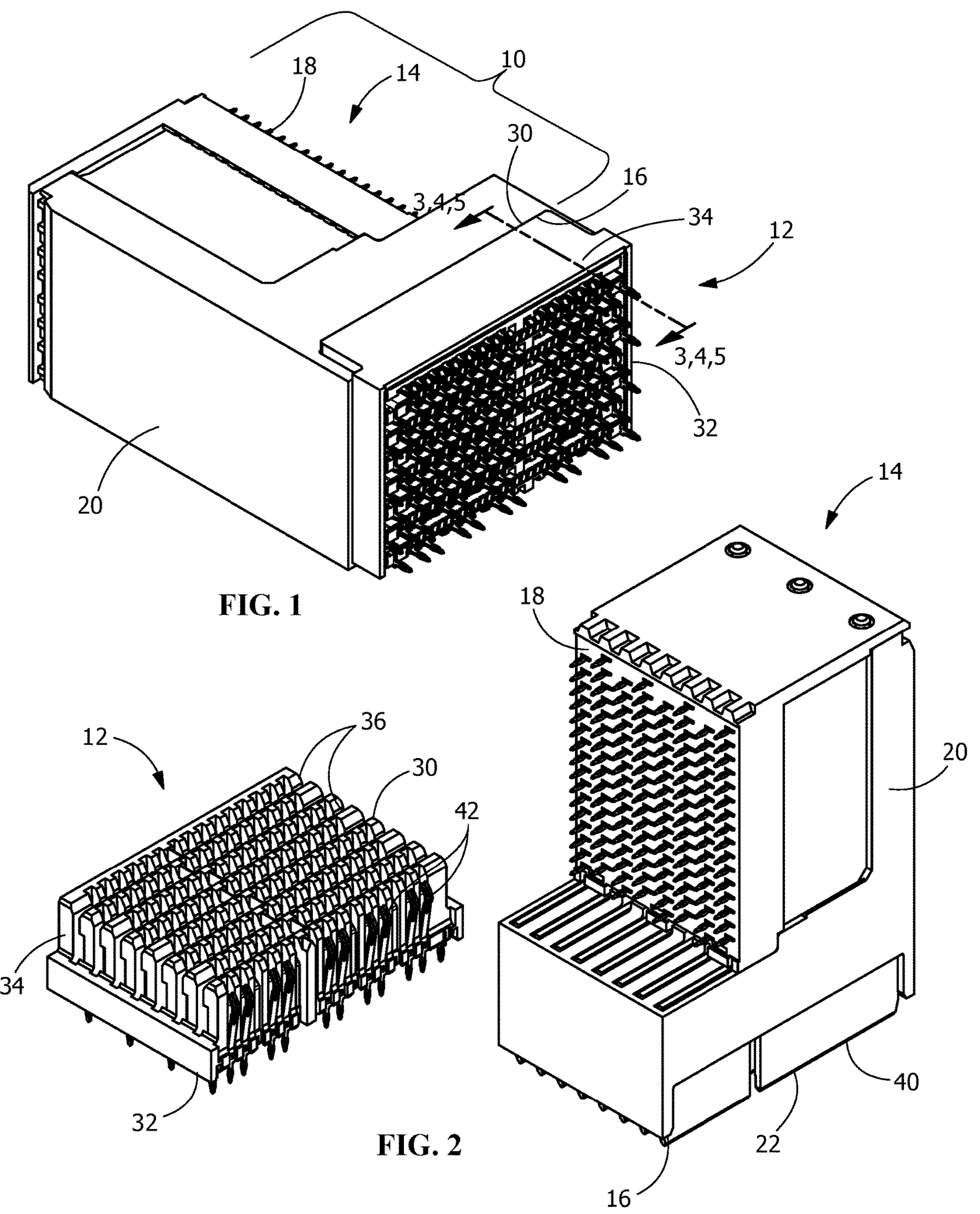
FIG. 1 is a bottom perspective view of illustrative mated connector assemblies with an illustrative daughter card connector assembly mated to an illustrative backplane connector assembly.
FIG. 2 is a perspective view of the illustrative connector assembly of FIG. 1 with the with the daughter card connector assembly and the backplane connector assembly shown in an unmated state.
Figure 3:
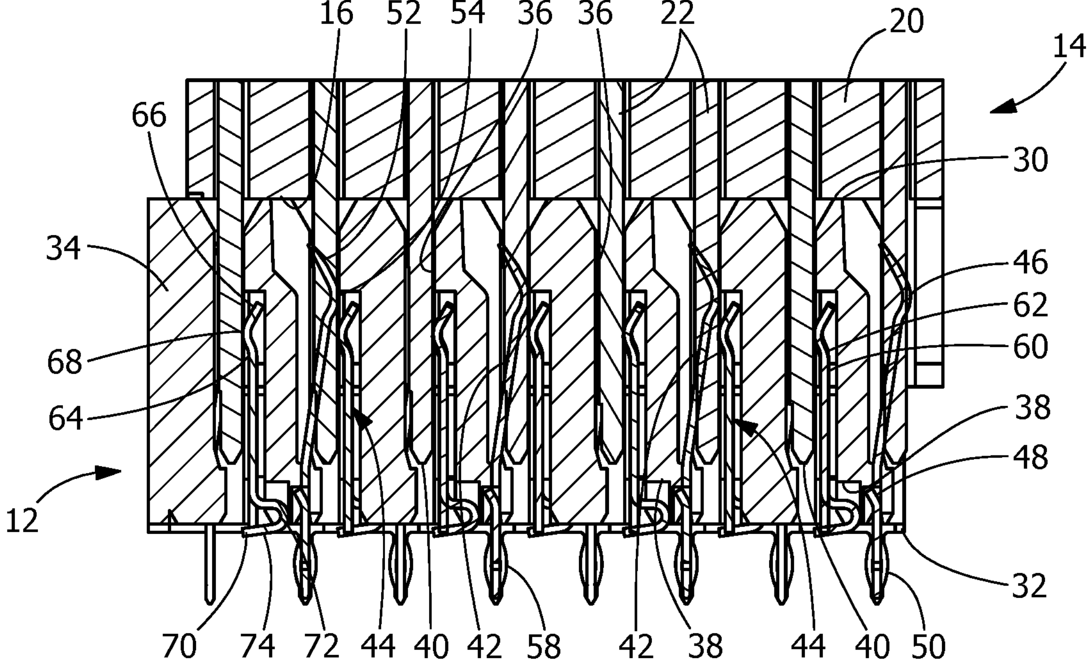
FIG. 3 is a cross-sectional view taken along line 3-3 of FIG. 1.
Figures 4, 5, 6:
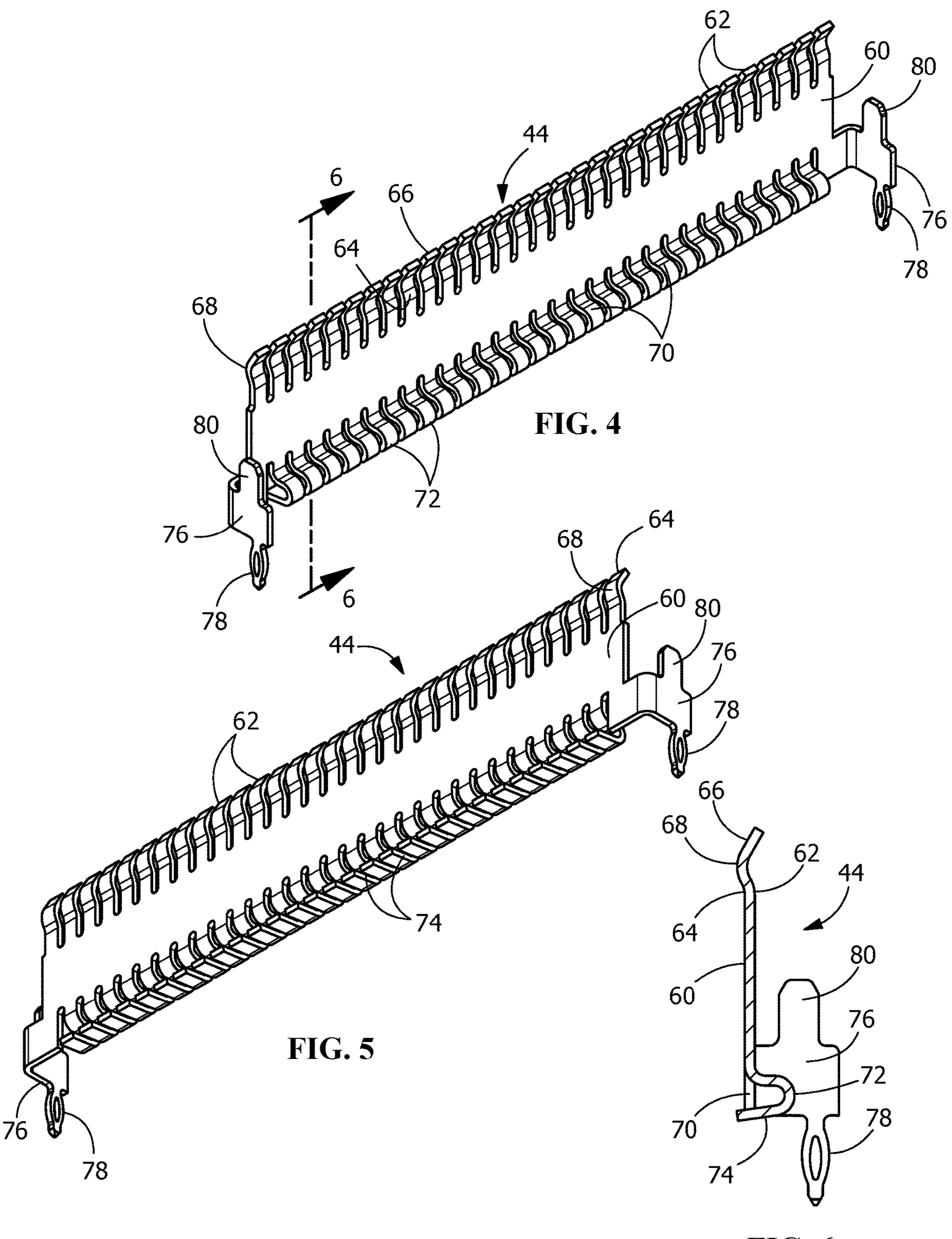
FIG. 4 is a back perspective view of one of the illustrative ground shield contact members of the backplane connector assembly of FIG. 2.
FIG. 5 is a front perspective view of the ground shield contact member of FIG. 4.
FIG. 6 is a side view the ground shield contact member of FIG. 4.

The accompanying drawings, which are incorporated into and form a part of the specification, schematically illustrate one or more exemplary embodiments of the invention and, together with the general description given above and detailed description given below, serve to explain the principles of the invention.

DETAILED DESCRIPTION OF THE INVENTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features, the scope of the invention being defined by the claims appended hereto.

Exemplary embodiments of the present invention are now described with reference to the Figures. Reference numerals are used throughout the detailed description to refer to the various elements and structures. Although the following detailed description contains many specifics for the purposes of illustration, a person of ordinary skill in the art will appreciate that many variations and alterations to the following details are within the scope of the invention. Accordingly, the following embodiments of the invention are set forth without any loss of generality to, and without imposing limitations upon, the claimed invention.

FIGS. 1 and 2 illustrate an illustrative electrical connector system 10 having a backplane connector 12 and a daughtercard connector 14 that are used to electrically connect a backplane circuit board (not shown) and a daughtercard circuit board (not shown). While the electrical connector system 10 is described herein with reference to backplane connectors 12 and daughtercard connectors 14, it is realized that the subject matter herein may be utilized with different types of electrical connectors other than a backplane connector or a daughtercard connector. The backplane connector 12, and the daughtercard connector 14 are merely illustrative of an electrical connector system 10.

In the illustrative embodiment shown, the daughtercard connector 14 constitutes a right angle connector wherein a mating interface 16 and mounting interface 18 of the daughtercard connector 14 are oriented perpendicular to one another. The daughtercard connector 14 is mounted to the daughtercard circuit board at the mounting interface 18. Other orientations of the interfaces 16, 18 are possible in alternative embodiments.

Figures 9, 10:
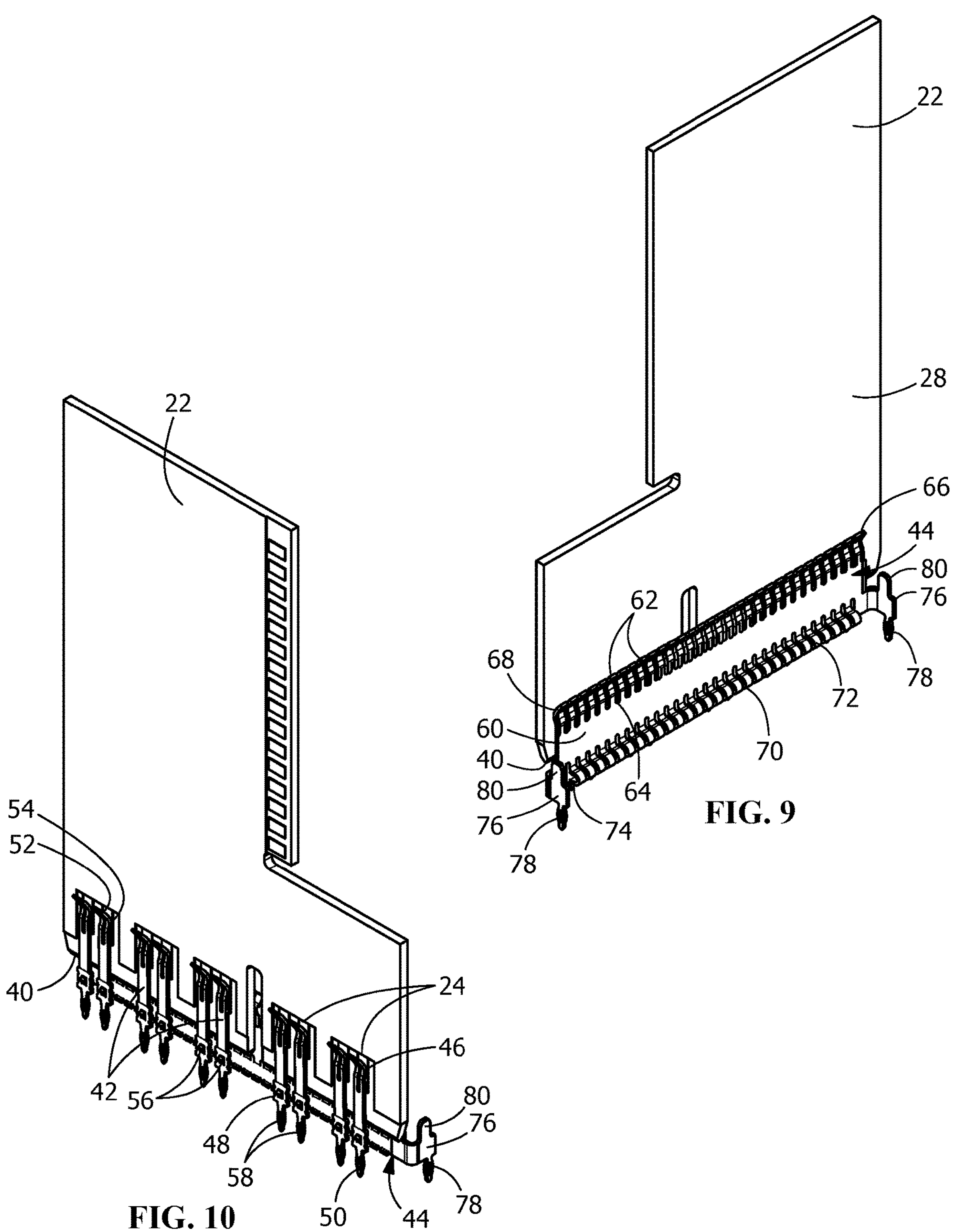
FIG. 9 is a perspective view of a ground shield contact member of the backplane connector assembly in engagement with a respective wafer of the connector assembly, the housing of the backplane connector and the connector assembly are not shown.
FIG. 10 is a perspective view of signal contact beams of the backplane connector assembly in engagement with a respective wafer of the connector assembly, the housing of the backplane connector and the connector assembly are not shown.

The daughtercard connector 14 includes a housing 20, made of one or more components, holding a plurality of wafers 22, such as, but not limited to circuit boards therein. The wafers 22 may have different configuration, such as, but not limited to, microstrip (two layer) or stripline (four or more layers). In the illustrative embodiment, the wafers 22 have pairs of individual signal pathways or traces (not shown) that extend between the mating interface 16 and the mounting interface 18. The signal traces have signal conductive pads 24 (FIG. 10) provided proximate the mating interface 16. The wafers 22 have a ground plane member 28 (FIG. 9) on opposites sides of the wafer 22 from the signal conductive pads 24. The ground plane member 28 extend between the mating interface 16 and the mounting interface 18. In alternative embodiments, the wafer 22 may be contact modules, the signal traces may be mating signal contacts and the ground traces may be ground contacts.

In the illustrated embodiment, the backplane connector 12 constitutes a header connector mounted to the backplane circuit board. However, other types of connectors may be used. When the backplane connector 12 is mated to the daughtercard connector 14, the daughtercard circuit board is oriented generally perpendicular with respect to the backplane circuit board.

As is shown in FIG. 2, the backplane connector 12 includes a mating end 30 and a mounting end 32 that are oriented generally parallel to one another. The backplane connector 12 is mounted to the backplane circuit board at the mounting end 32. Other orientations of the mating end 30 and the mounting end 32 are possible in alternative embodiments.

In the illustrative embodiment, the backplane connector 12 includes a one piece housing 34. Alternatively, the housing may include a plurality of individual housings or modules. The housing 34 has one or more wafer receiving slots 36 which extend from the mating end 30 toward the mounting end 32. The housing 34 holds at least one row of signal contacts 42 and at least one ground shield contact member 44. The at least one row of signal contacts 42 are positioned on one side of the one or more wafer receiving slots 36. The at least one ground shield contact member 44 is positioned on an opposed side of the one or more wafer receiving slots 36.

The signal contacts 42 extend between the mating end 30 and the mounting end 32. In the exemplary embodiment, the signal contacts 42 are arranged in pairs carrying differential signals. However, in other configurations, the signal contacts 42 may not be arranged in pairs for carrying differential signals, such as carrying single ended signals. The ground shield contact member 44 extends between the mating end 30 and the mounting end 32.

Each signal contact 42 has a resilient contact arm 46, a securing section 48 and circuit board mounting section 50. In the illustrative embodiment shown, each of the resilient contact arms 46 has a lead in portion 52 and an engagement portion 54. The resilient contact arms 46 are configured to press against the signal conductive pads 24 of the signal traces of the wafers 22 of the daughter card connector 14 when the daughter card connector 14 is inserted into the wafer receiving slots 36 of the backplane connector 12.

The securing section 48 has retention members 56, which may be, but are not limited to barbs or projections, which extend from surfaces of the securing section 48. The retention members 56 cooperating with the housing 34 to retain the signal contacts 42 in the backplane connector 12.

The circuit board mounting section 50 has a compliant portion 58, such as an eye of the needle pin, although other configurations may be used. The configuration of the signal contact 42 is meant to be illustrative as other embodiments of the signal contact may be used. For example, the signal contacts 42 may have asymmetrical or other configurations which allows for optimal performance under different conditions. The circuit board mounting section 50 cooperate with the backplane circuit board to retain the signal contacts 42 to the backplane circuit board.

As shown in FIGS. 3 through 9, the ground shield contact member 44 has a planar ground shield portion 60. Ground shield resilient contact beams or ground shield contact spring fingers 62 extend from a first end of the ground shield portion 60. In the illustrative embodiment shown, the ground shield contact beams 62 are spaced uniformly along the length of the ground shield portion 60, however other configurations may be used. The ground shield contact member 44 makes the ground connection between the backplane circuit board and the wafer 22 and is configured to provide both mechanical integrity and signal integrity.

Each ground shield contact beams 62 has a ground shield resilient contact arm 64 with a lead in portion 66 and an engagement portion 68. The resilient contact arms 64 are configured to press against the ground plane member 28 of the daughter card connector 14 when the daughter card connector 14 is mated to the backplane connector 12.

Resilient members 70 extend from a second end of the ground shield portion 60. The second end of the ground shield portion 60 is opposed to the first end of the ground shield portion 60. In the illustrative embodiment shown, the resilient members 70 are spaced uniformly along the length of the ground shield portion 60, however other configurations may be used. The longitudinal axis of each of the resilient members 70 is offset from the longitudinal axis of each of the ground shield contact beams 62.

Each of the resilient members 70 has a U-shaped member 72 (when viewed in FIGS. 7 and 8) which extends from the ground shield portion 60. The U-shaped members 72 are received in a cavity 38 which extends from each of the one or more wafer receiving slots 36. The cooperation of the U-shaped members 72 with walls of the cavities 38 helps to retain each of ground shield contact members 44 in position in the housing 34.

A circuit board engaging surface 74 is provided at a free end of each of the U-shaped member 72. The circuit board engaging surface 74 is configured to engage and make an electrical connection with contact pads on the surface of the backplane circuit board.

In the illustrative embodiment shown, ground contacts 76 are provided at the ends of the ground shield portion 60. The ground contacts 76 provide additional ground connections between the ground shields of the daughtercard connector 14 and the backplane. The ground contacts 76 extend approximately perpendicular to the plane of the ground shield portion 60 and have securing portions 78. In the embodiment shown, the securing portions 78 are eye of the needle compliant members, but other types of securing portions 78 may be used. Retention tabs 80 may also be provided on the ground contacts 76. The retention tabs 80 cooperate with the housing 34 of the backplane connector 12 to secure the ground shield contact member 44 in position.

Figure 7:
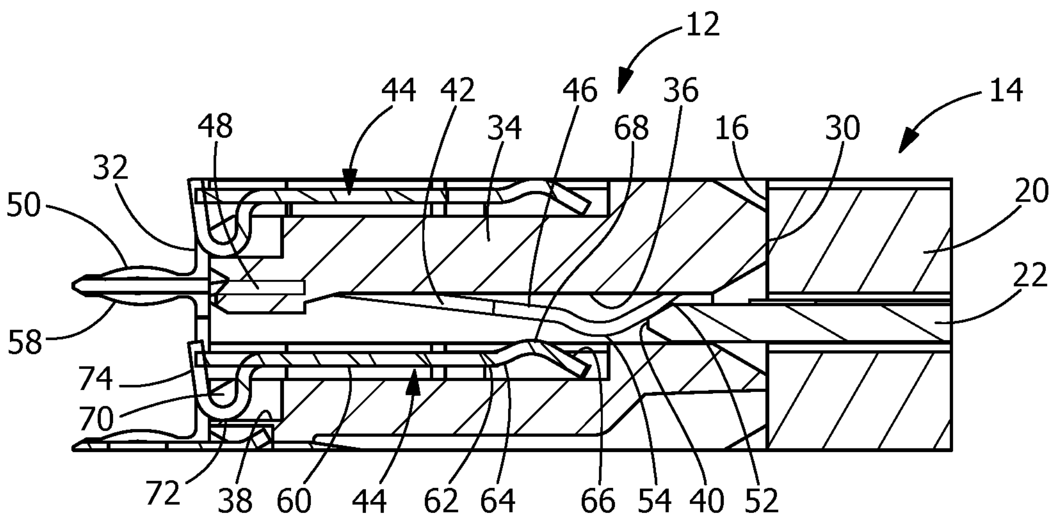
FIG. 7 is a cross-sectional view of an illustrative single mating cavity of the backplane connector assembly with a respective wafer of the connector assembly partially inserted into the mating cavity.
Figure 8:
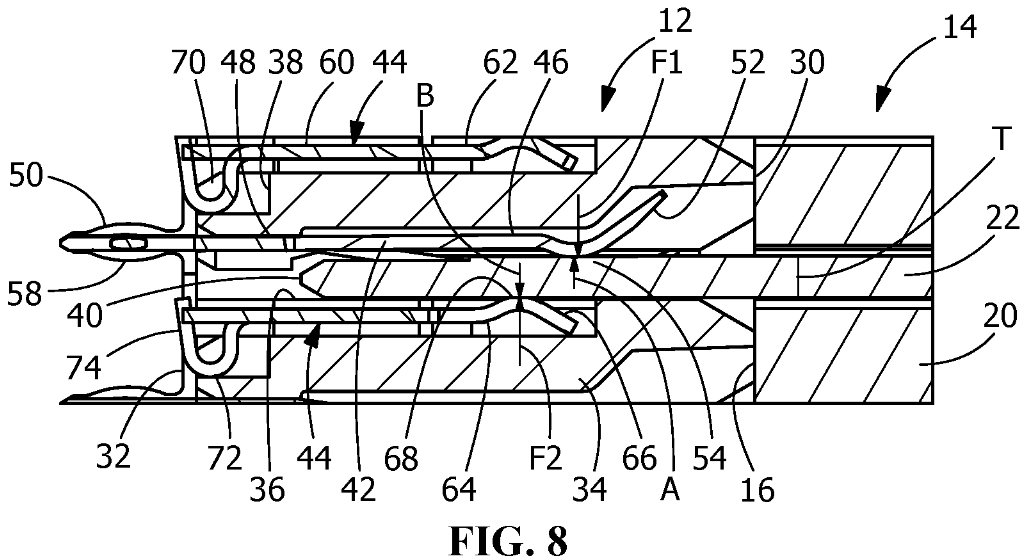
FIG. 8 is a cross-sectional view of the single mating cavity of FIG. 7 with the respective wafer fully inserted into the mating cavity, ground shield contact spring fingers of ground shield contact member bias the wafer toward signal contact beams in the backplane connector assembly.

Referring to FIGS. 7 and 8, the insertion of the wafers 22 into the wafer receiving slots 36 is illustrated. As the daughtercard connector 14 is mated with the backplane connector 12, the mating interface 16 of the daughtercard connector 14 engages and is inserted over the mating end 30 of the backplane connector 12. As this occurs, the leading ends 40 of the wafers 22 are positioned in respective slots 36 of the backplane connector 12.

As insertion continues, the leading ends 40 are moved past the lead in portions 52 and the engagement portions 54 of the resilient contact arms 46 of the signal contacts 42, causing the resilient contact arms 46 to be moved in the direction of arrow A in FIG. 8. This movement causes the engagement portions 54 of the resilient contact arms 46 to exert a normal force F1 on the wafer 22.

Continued insertion of the wafers 22 into the slots 36 causes the leading ends 40 to be moved past the lead in portions 66 and the engagement portions 68 of the resilient contact arms 64 of the ground shield contact member 44, causing the resilient contact arms 64 to be moved in the direction of arrow B in FIG. 8. This movement causes the engagement portions 68 of the resilient contact arms 64 to exert a normal force F2 on the wafer 22.

Due to the configuration of the ground shield contact members 44, including the cooperation of the resilient members 70 with the housing 14, the force F2 applied by the resilient contact arms 64 to the wafers 22 is greater than the force F1 applied by the resilient contact arms 46 to the wafers 22. This results in the resilient contact arms 64 of the ground shield contact members 44 biasing the wafers 22 toward the resilient contact arms 46 of the signal contacts 42.

Because the sum of the normal forces F2 are always greater than the sum of the normal forces F1, the wafer 22 will always be biased toward the resilient contact arms 46 of the signal contacts 42 regardless of the thickness T of the wafer 22. As the wafers 22 are always biased toward the signal contacts 42, the normal force exerted by the resilient contact arms 46 of the signal contacts 42 can be determined and controlled without regard to the thickness T of the wafers 22. The normal force F1 exerted on the wafer 22 is independent of the wafer thickness tolerance.

As the positioning of the wafer 22 is controlled by the normal force F2 of the resilient contact arms 64 of the ground shield contact members 44, the normal force F1 exerted by the resilient contact arms 46 of the signal contacts 42 must only be sufficient to ensure that proper contact is made and maintained between the properly positioned signal contact pads 24 of the wafers 22 and the engagement portions 54 of the resilient contact arms 46 of the signal contacts 42. As this normal force is less than required for known signal contacts, the length of the signal contacts 42 can be minimized as less force is required. The allows the length of the resilient contact arms 46 of the signal contacts 42 and the signal contact length to be minimized for signal integrity purposes while still meeting the normal force requirements for a reliable contact system.

Because the overall tolerance from the base of the resilient contact arms 46 of the signal contacts 42 to the front side of the wafers 22 is reduced, the resilient contact arms 46, and the signal contacts 42 in general, can be shorter in length (less working range is needed for mechanical purposed to achieve required normal force) which improves the signal integrity of the backplane connector 12, as there is less opportunity for crosstalk between signal contacts 42.

Another advantage of the present invention is that the ground contacts from known wafer based connector systems can be eliminated. The ground shield contact member 44 combines the function of ground contacts and shielding into one component. In addition, the ground shield contact member 44 can be tuned for signal integrity to eliminate the need for the ground contacts between sets of differential contact pairs.

The ground shield contact member 44 can increase the current/power capacity for a wafer-based power contact system. For high power/current wafers 22, the ground shield contact member 44 provides a current path to the back side of the wafers 22 in addition to the current path on the front side of the wafers provided by the signal contacts 42, as shown in FIG. 8.

Figure 11:
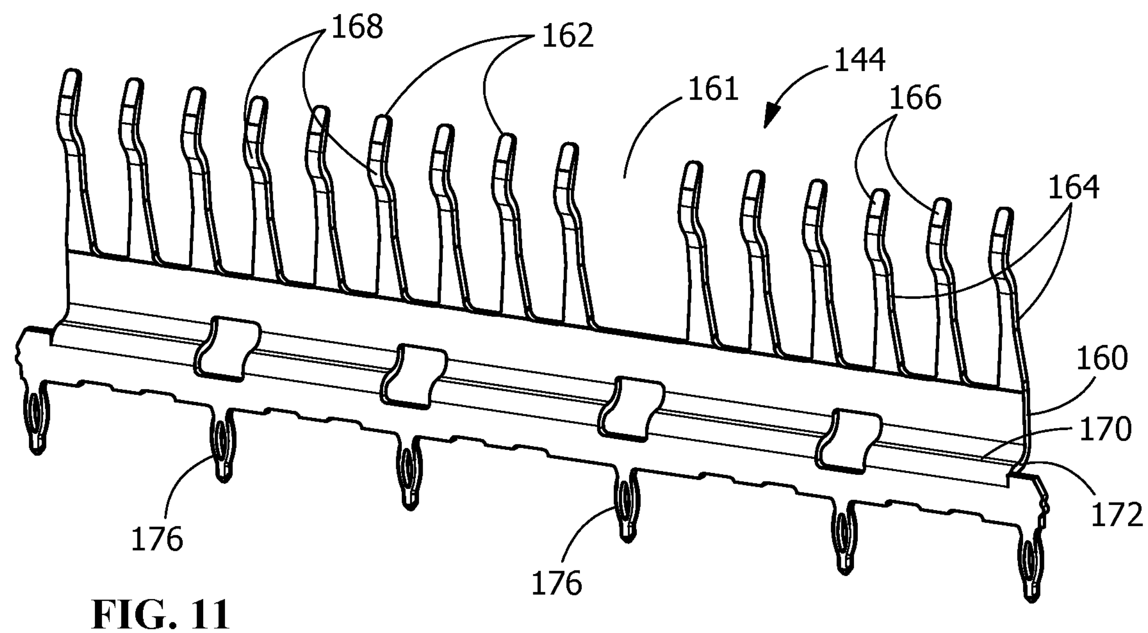
FIG. 11 is a front perspective view of an alternate illustrative ground shield contact member of the backplane connector assembly.
Figure 12:
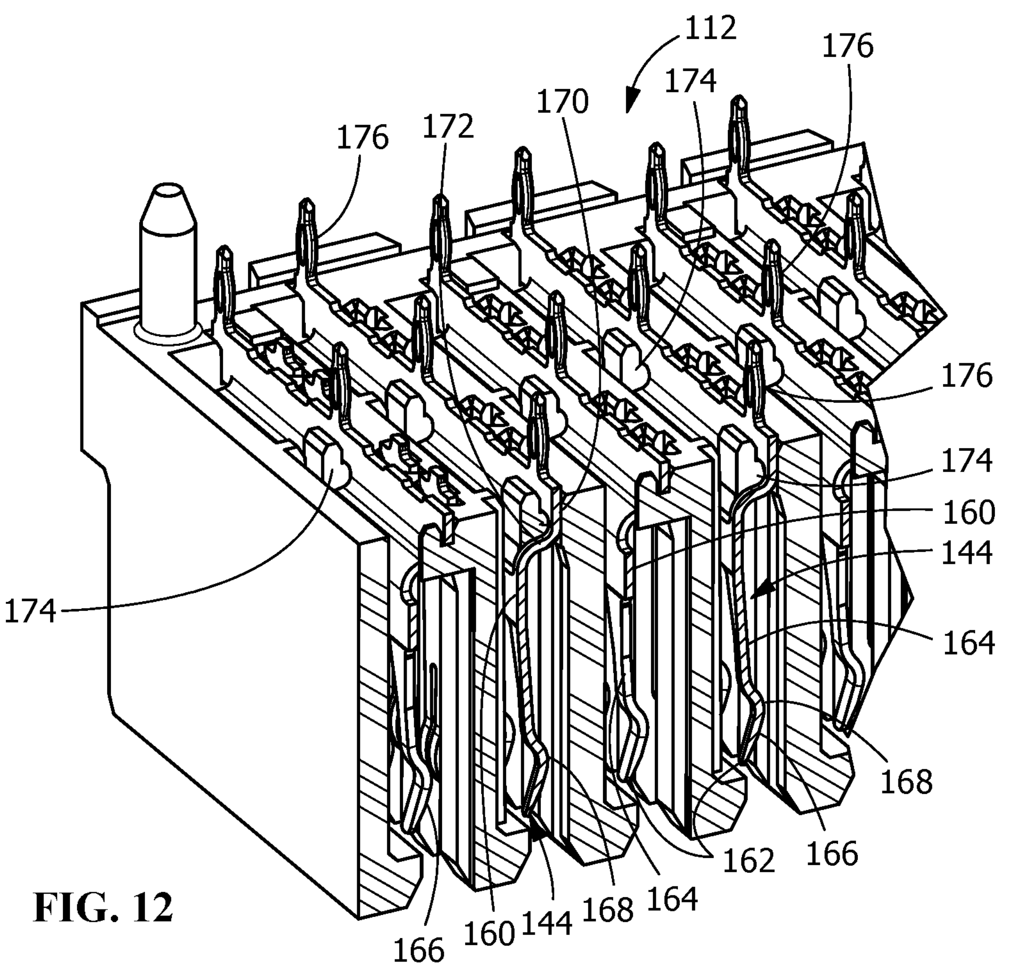
FIG. 12 is a perspective cross-sectional view of a plurality of ground shield contact members of FIG. 11 positioned in an illustrative backplane connector.

As shown in FIGS. 11 and 12, an alternate illustrative ground shield contact member 144 has a planar ground shield portion 160. Ground shield resilient contact beams or ground shield contact spring fingers 162 extend from a first end of the ground shield portion 160. In the illustrative embodiment shown, the ground shield contact beams 162 are spaced generally uniformly along the length of the ground shield portion 160, with a larger space 161 provided in one area, however other configurations may be used. Similar to the ground shield contact member 44, the ground shield contact member 144 makes the ground connection between the backplane circuit board and the wafer 22 and is configured to provide both mechanical integrity and signal integrity.

Each ground shield contact beams 162 has a ground shield resilient contact arm 164 with a lead in portion 166 and an engagement portion 168. The resilient contact arms 164 are configured to press against the ground plane member 28 of the daughter card connector 14 when the daughter card connector 14 is mated to the backplane connector 112.

Securing sections 170 extend from second ends of the ground shield portions 160. The second ends of the ground shield portions 160 are opposed to the first ends of the ground shield portions 160. In the illustrative embodiment shown, the securing sections 170 are bent out of the plane of the ground shield portions 160. A portion 172 of the securing sections 170 extend approximate perpendicular to the ground shield portions 160, although other configurations may be used.

As shown in FIG. 12, the securing sections 170 cooperate with securing projections 174 of the backplane connector 112 to retain the ground shield contact member 144 in the backplane connector 112.

Mounting members 176 extend from the securing sections 170. The mounting members 176 are positioned to be essentially parallel to, but offset from the plane of the ground shield portions 160. In the embodiment shown, the mounting members 176 are eye of the needle compliant members, but other types of mounting members 176 may be used. The mounting members 176 are configured to engage and make an electrical connection with through holes of the backplane circuit board.

The function and operation of the ground shield contact member 144 and the ground shield contact beams 162 are identical to the function and operation of the ground shield contact member 44 and the ground shield contact beams 62. The benefits and advantages of using the ground shield contact member 144 is also identical to the benefits and advantage of the ground shield contact member 44.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

What is claimed:

1. An electrical connector comprising:

a housing having at least one slot for receiving an electrical wafer therein;

signal contacts positioned on a first side of the at least one slot, the signal contacts having signal contact resilient contact arms extending into the at least one slot, the signal contact resilient contact arms exert a first normal force on the electrical wafer inserted in the at least one slot;

at least one ground shield contact member positioned on a second side of the at least one slot, the second side being opposed to the first side, the at least one ground shield contact member having ground shield resilient contact arms extending into the at least one slot, the ground shield resilient contact arms exert a second normal force on the wafer inserted in the at least one slot;

the at least one ground shield contact member has a planar ground shield portion, the ground shield resilient contact arms extending from a first end of the planar ground shield portion, resilient members extend from a second end of the planar ground shield portion, the second end of the planar ground shield portion is opposed to the first end of the planar ground shield portion;

the second normal force exerted by the ground shield resilient contact arms is greater than the first normal force exerted by the signal contact resilient contact arms;

wherein the wafer is biased toward the signal contact resilient contact arms of the signal contacts regardless of a thickness of the wafer allowing the first normal force exerted on the wafer to be independent of a wafer thickness tolerance.

2. The electrical connector as recited in claim 1, wherein the ground shield resilient contact arms are spaced uniformly along the length of the planar ground shield portion.

3. The electrical connector as recited in claim 2, wherein the ground shield resilient contact arms have lead in portions and engagement portions, the engagement portions press against a ground plane member of the wafer when the wafer is inserted into the at least one slot.

4. The electrical connector as recited in claim 1, wherein the resilient members are spaced uniformly along the length of the planar ground shield portion.

5. The electrical connector as recited in claim 4, wherein a longitudinal axis of each of the resilient members is offset from a longitudinal axis of each of the ground shield resilient contact arms.

6. The electrical connector as recited in claim 4, wherein the resilient members have U-shaped members.

7. The electrical connector as recited in claim 6, wherein circuit board engaging surfaces are provided at free ends of the of the U-shaped members, the circuit board engaging surfaces are configured to engage and make an electrical connection with contact pads on a surface of a backplane circuit board.

8. The electrical connector as recited in claim 1, wherein ground contacts are provided at ends of the planar ground shield portion of the at least one ground shield contact member.

9. The electrical connector as recited in claim 1, wherein the at least one ground shield contact member provides grounding and shielding the electrical connector.

10. The electrical connector as recited in claim 1, wherein the signal contacts have the signal contact resilient contact arms, securing sections and mounting sections.

11. The electrical connector as recited in claim 10, wherein the signal contact resilient contact arms have lead in portions and engagement portions, the engagement portions press against signal conductive pads of the wafer when the wafer is inserted into the at least one slot.

12. The ground shield contact component as recited in claim 1, wherein a signal contact length across the signal contacts is minimized for signal integrity purposes while still meeting the normal force requirements for a reliable contact system.

13. An electrical connector comprising:

a housing having at least one slot for receiving an electrical wafer therein;

signal contacts positioned on a first side of the at least one slot, the signal contacts having signal contact resilient contact arms extending into the at least one slot, the signal contact resilient contact arms exert a first normal force on the electrical wafer inserted in the at least one slot;

at least one ground shield contact member positioned on a second side of the at least one slot, the second side being opposed to the first side, the at least one ground shield contact member having ground shield resilient contact arms extending into the at least one slot, the ground shield resilient contact arms exert a second normal force on the wafer inserted in the at least one slot;

the second normal force exerted by the ground shield resilient contact arms is greater than the first normal force exerted by the signal contact resilient contact arms;

wherein the wafer is biased toward the signal contact resilient contact arms of the signal contacts regardless of a thickness of the wafer allowing the first normal force exerted on the wafer to be independent of a wafer thickness tolerance;

wherein a securing section extends from a second end of the planar ground shield portion, the second end of the planar ground shield portion is opposed to the first end of the planar ground shield portion.

14. The electrical connector as recited in claim 13, wherein the securing the securing section is bent out of the plane of the ground shield portion, the securing section cooperates with securing projections of the connector to retain the ground shield contact member in the connector.

15. The electrical connector as recited in claim 14, wherein a portion of the securing section extends approximate perpendicular to the ground shield portion.

16. The electrical connector as recited in claim 14, wherein mounting members extend from the securing sections, the mounting members are configured to engage and make an electrical connection with through holes of a backplane circuit board.

17. An electrical connector comprising:

a housing having at least one slot for receiving an electrical wafer therein;

signal contacts positioned on a first side of the at least one slot, the signal contacts having signal contact resilient contact arms extending into the at least one slot, the signal contact resilient contact arms exert a first normal force on the electrical wafer inserted in the at least one slot;

at least one ground shield contact member positioned on a second side of the at least one slot, the second side being opposed to the first side, the at least one ground shield contact member having ground shield resilient contact arms extending into the at least one slot, the ground shield resilient contact arms exert a second normal force on the wafer inserted in the at least one slot;

the second normal force exerted by the ground shield resilient contact arms is greater than the first normal force exerted by the signal contact resilient contact arms;

wherein the wafer is biased toward the signal contact resilient contact arms of the signal contacts regardless of a thickness of the wafer allowing the first normal force exerted on the wafer to be independent of a wafer thickness tolerance;

wherein the at least one ground shield contact member makes a ground connection from a backplane circuit board on which the electrical connector is mounted to ground planes of the wafer, the at least one ground shield contact member provides mechanical stability and signal integrity.

* * * * *